United States Patent
Koudar

(10) Patent No.: US 11,289,134 B2
(45) Date of Patent: Mar. 29, 2022

(54) NON-VOLATILE MEMORY READING CIRCUITS AND METHODS FOR REDUCING SENSING DELAY PERIODS

(71) Applicant: SEMICONDUCTOR COMPONENTS INDUSTRIES, LLC, Phoenix, AZ (US)

(72) Inventor: Ivan Koudar, Modrice (CZ)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 17/037,948

(22) Filed: Sep. 30, 2020

(65) Prior Publication Data

US 2021/0125645 A1 Apr. 29, 2021

Related U.S. Application Data

(60) Provisional application No. 62/924,696, filed on Oct. 23, 2019.

(51) Int. Cl.
| | | |
|---|---|---|
| *G11C 16/26* | (2006.01) | |
| *G11C 7/08* | (2006.01) | |
| *G11C 7/12* | (2006.01) | |
| *G11C 8/10* | (2006.01) | |

(52) U.S. Cl.
CPC .............. *G11C 7/08* (2013.01); *G11C 7/12* (2013.01); *G11C 8/10* (2013.01)

(58) Field of Classification Search
CPC ............. G11C 7/08; G11C 7/12; G11C 8/10
USPC ........................................................ 365/203
See application file for complete search history.

(56) References Cited

U.S. PATENT DOCUMENTS

| | | |
|---|---|---|
| 6,307,797 B1 | 10/2001 | Fourel |
| 6,791,367 B2 | 9/2004 | Terizoglu |
| 2005/0117411 A1 | 6/2005 | Koshikawa |
| 2009/0230990 A1* | 9/2009 | Terzioglu ............. G11C 29/785 326/38 |
| 2014/0286096 A1 | 9/2014 | Chong |

FOREIGN PATENT DOCUMENTS

DE 60305999 T2 2/2007

OTHER PUBLICATIONS

German Patent Application No. 10220127619.2, Search Report, dated May 11, 2021 (Google Translation).

\* cited by examiner

*Primary Examiner* — Xiaochun L Chen
(74) *Attorney, Agent, or Firm* — Wash Park IP Ltd.; John T. Kennedy

(57) ABSTRACT

Devices, systems, and methods for reducing sensing delays for a non-volatile memory reading circuit may include operations for pre-charging a plurality of bit lines coupling a memory array having multiple bit cells with a sensing amplifier. Upon receiving a read request identifying a given bit cell in the memory array, the addressed bit line is decoupled from a bias voltage. The addressed bit line corresponds to the given bit cell and is selected from the plurality of bit lines. With the decoupling from the bias voltage, the addressed bit lines are coupled to the sensing amplifier. After a sensing circuit delay, data stored in the given bit cell is provided to the sensing amplifier via the addressed bit lines coupled to the sensing amplifier. The data stored in the given bit cell may then be interpreted by the sensing amplifier and a corresponding data output signal is generated.

20 Claims, 7 Drawing Sheets

NON-VOLATILE MEMORY READING CIRCUITS AND METHODS FOR REDUCING SENSING DELAY PERIODS

CROSS REFERENCE TO RELATED APPLICATIONS

The present application claims priority to and incorporates by reference, in its entirety, U.S. Provisional Application Ser. No. 62/924,696, filed on Oct. 23, 2019, in the name of inventor Ivan Koudar, and entitled "High Temperature FreeProm Advanced Reading Circuitry."

TECHNICAL FIELD

The technology described herein generally relates to circuits and methods for reading non-volatile memories ("NVM"). More specifically, the technology described herein relates to circuits and methods configured for use in reducing delay periods associated with a reading of a selected NVM cell.

BACKGROUND

Commonly, reading circuits for memory cells experience a delay period after selection of and before reading of a given memory cell may occur. This delay period commonly arises due to a need to recharge address lines coupling a selected memory cell with a sensor configured to read values stored in a memory cell, such values being represented by electrical currents provided on the address lines. More specifically, before a sensing amplifier can read the values on the selected address lines, as represented by a bit cell current, the voltage potential on the address lines need to be recharged to a given value. Each time a different memory cell is selected to be read by a given sensing amplifier, the voltages on the address lines corresponding to the selected memory cell need to be recharged. While such recharging is occurring, the recharge currents on the address lines typically exceed a maximum sensitivity level for a given sensing amplifiers. Further, such recharging occurs for a given period and is commonly referred to as giving rise to a sensing delay period. The responsiveness of a given memory array is often determined in view, at least in part, of the sending delay period. A longer sensing delay period typically results in an NVM having a slower read rates.

Further it is appreciated that the recharge period is needed due to the parasitic capacitances arising in the sensing amplifier itself and between the two or more data lines. Given such capacitances, the sensing delay period is commonly proportional to the currents applied to the address lines to increase the voltage potentials on such address lines and overcome the parasitic capacitances arising thereon and therebetween. Various approaches seek to decrease the sensing delay period by using higher recharge currents. Yet, while such higher currents often reduce the sensing delay period, various operational costs are typically incurred, such as, requiring higher voltages (with associated impacts on battery life and power consumption of a device), increasing the heat generated by the reading circuit, and other undesired operational side-effects. Further, it is to be appreciated that as a temperature for a given NVM increases, ever higher voltages are commonly required to recharge the address lines. When higher voltages are used recharge the address lines—the high temperatures generated intrinsically decrease the gain and increase the intrinsic resistances of the address lines and of the sensing amplifier. Accordingly, a need exists for NVM reading circuits and methods for use of such circuits which address these and other concerns.

SUMMARY

The various embodiments of the present disclosure describe NVM reading circuits and methods for reducing sensing delay periods.

In accordance with at least one embodiment of the present disclosure, a method, for reducing sensing delays for a non-volatile memory reading circuit may include pre-charging a plurality of bit lines coupling a memory array having multiple bit cells with a sensing amplifier. Upon receiving a read request identifying a given bit cell in the memory array, an addressed bit line may be decoupled from a bias voltage. The addressed bit line corresponds to the given bit cell and is selected from the plurality of bit lines. The addressed bit lines may then be coupled to the sensing amplifier. After a sensing circuit delay, data stored in the given bit cell may be provided to the sensing amplifier via the addressed bit lines coupled to the sensing amplifier. The data stored in the given bit cell may be interpreted by the sensing amplifier. A data output signal corresponding to the interpreted data may be generated. The interpreting may occur after an output delay $t_{DO}$. The pre-charging may occur at a bias voltage $V_{BIAS}$. The bias voltage is a function of an ideal voltage $V_{IDEAL}$ for the sensing amplifier.

The ideal voltage $V_{IDEAL}$ may correspond to a bit line voltage $V_{BL}$. Upon coupling of the addressed bit line to the sensing amplifier, a voltage on the addressed bit line may be changed (increased or decreased) until substantially equal to the bit line voltage $V_{BL}$. A transient current may occur on the addressed bit line while the voltage on the addressed bit line increases or decreases to substantially equal to the bit line voltage $V_{BL}$. The transient current increases a total current on the addressed bit line. The sensing amplifier is configured to receive data from the given bit cell when the total current on the address bit line equals bit cell current only and without being disturbed by transient current. While the transient current exists, the total current on the address bit line is sum of the bit cell current and the transient current. The bias voltage $V_{BIAS}$ facilitates a decrease in an amount of time during which the transient current exists. A bit cell value is correctly discriminated when the bit line current is free of the transient current and exceeds the sensing amplifier threshold $SA_{TH}$.

A transient current may occur on the addressed bit line while the voltage on the addressed bit line increases to substantially equal to the bit line voltage $V_{BL}$. The transient current increases a total current on the addressed bit line. The sensing amplifier may be configured to receive data from the given bit cell when the total current on the address bit line is below a sensing amplifier threshold $SA_{TH}$. While the transient current exists, the total current on the address bit line may exceed the sensing amplifier threshold $SA_{TH}$. The bias voltage $V_{BIAS}$ may result in a decrease in an amount of time during which the total current exceeds the sensing amplifier threshold $SA_{TH}$.

For at least one embodiment, the bias voltage $V_{BIAS}$ may be sufficient to overcome one or more parasitic capacitances arising between two or more of the addressed bit lines and the plurality of bit lines. The pre-charging of the plurality of bit lines may reduce currents used to overcome parasitic capacitances arising between two or more of the plurality of bit lines. The pre-charging of the plurality of bit lines may reduce operating temperatures of the non-volatile memory reading circuit.

For at least one embodiment, the coupling and decoupling of the addressed bit lines may occur in a multiplexer configured to couple two or more of the multiple bit cells with the sensing amplifier.

In accordance with at least one embodiment of the present disclosure, a multiplexer may be configured to reduce sensing delay periods for memory reading circuits and may include a first bias switch coupled to a first bit line, and a first read switch coupled to the first bit line. The first bit line may be coupled between a first bit cell of a memory array and a bias supply when the first bias switch is in a closed state and the first read switch is in an open state. The first bit line may be coupled between the first bit cell of the memory array and a sensing amplifier when the first bias switch is in an open state and the first read switch is in a closed state. The first bias switch and the first read switch have opposing states.

For at least one embodiment, the multiplexer may include a second bias switch coupled to a second bit line, and a second read switch coupled to a second bit line. The second bit line may be coupled between a second bit cell of the memory array and the bias supply when the second bias switch is in a closed state and the second read switch is in an open state. The second bit line may be coupled between the second bit cell of the memory array and the sensing amplifier when the second bias switch is in an open state and the second read switch is in a closed state. The second bias switch and the second read switch have opposing states. The first bias switch and the second bias switch have opposing states. The bias supply may provide a bias voltage $V_{BIAS}$ for use in pre-charging the first bit line when the first bias switch is closed. The first bit line may include a pair of bit lines for use in selectable coupling, at any given time, the first bit cell to one of the bias supply and the sensing amplifier. A difference current $I_{DIF}$ between currents on each of the pair of bit lines above a sensing amplifier threshold $SA_{TH}$ may incur a sensing circuit delay $t_{RO}$ during which a reading of data stored in the bit cell by the sensing amplifier is precluded.

The bias supply may be configured to provide a bias voltage $V_{BIAS}$ for use in pre-charging the pair of bit lines when the first bias switch is closed. The pre-charging of the pair of bit lines may reduce the sensing circuit delay $t_{RO}$. A difference current $I_{DIF}$ above a sensing amplifier threshold $SA_{TH}$ may incur a sensing circuit delay $t_{RO}$ during which a reading of data stored in the bit cell by the sensing amplifier is precluded. The difference current $I_{DIF}$ is a difference between a current on the first bit line $I_{BL}$ versus a reference current $I_{REF}$. The states of the first bias switch and the first read switch may be configured based upon an address provided by an address decoder.

In accordance with at least one embodiment of the present disclosure, a non-volatile memory reading circuit may include an address decoder, an array including a first bit cell and a second bit cell, a multiplexer having a first bias switch, a first read switch, a second bias switch, and a second read switch, a sensing amplifier, a bias supply, a first bit line, and a second bit line. The first bit cell may be selected by the address decoder. When so selected, the first bit line couples, via the first read switch, the first bit cell with the sensing amplifier and the second bit line couples, via the second bias switch, the second bit cell with the bias supply. When the second bit line is by the address decoder, the second bit line couples, via the second read switch, the second bit cell with the sensing amplifier and the first bit line couples, via the first bias switch, the first bit cell with the bias supply.

The bias supply may provide a bias voltage $V_{BIAS}$ selected to reduce a sensing circuit delay $t_{RO}$ incurred when a given of the first bit cell and the second bit cell is selected by the address decoder. The sensing circuit delay $t_{RO}$ incurred is a function of one or more parasitic capacitances arising between the first bit line and the second bit line. The bias voltage pre-charges a non-selected bit line to a bit line voltage $V_{BL}$ which is within ten millivolts (10 mV) of an ideal voltage $V_{IDEAL}$ for the sensing amplifier.

BRIEF DESCRIPTION OF THE DRAWINGS

The features, aspects, advantages, functions, modules, and components of the devices, systems and processes provided by the various embodiments of the present disclosure are further disclosed herein regarding at least one of the following descriptions and accompanying drawing figures. In the appended figures, similar components or elements of the same type may have the same reference number and may include an additional alphabetic designator, such as 108a-108n, and the like, wherein the alphabetic designator indicates that the components bearing the same reference number, e.g., 108, share common properties and/or characteristics. Further, various views of a component may be distinguished by a first reference label followed by a dash and a second reference label, wherein the second reference label is used for purposes of this description to designate a view of the component. When only the first reference label is used in the specification, the description is applicable to any of the similar components and/or views having the same first reference number irrespective of any additional alphabetic designators or second reference labels, if any.

DETAILED DESCRIPTION

Figure 1:
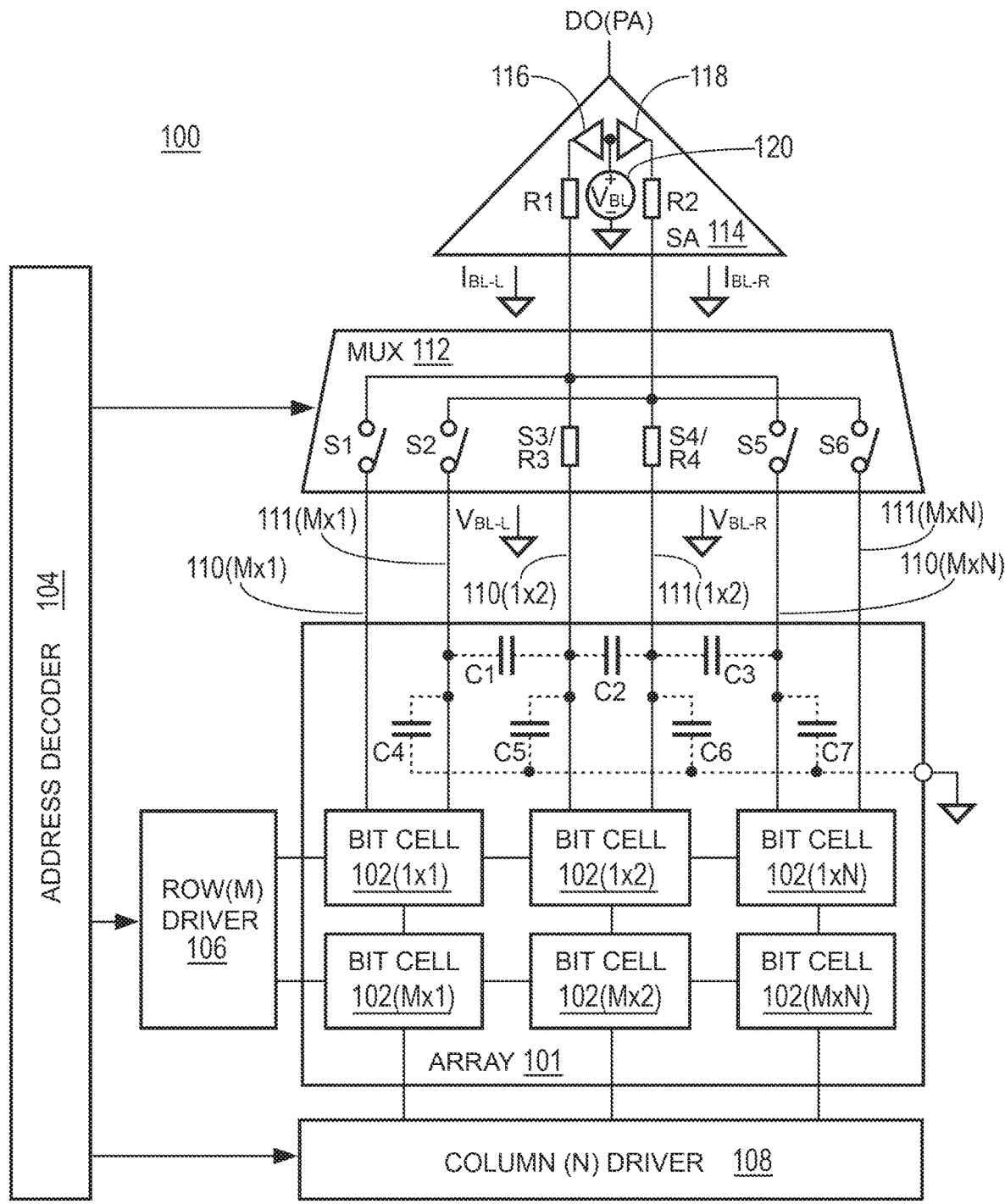
FIG. 1 is a schematic diagram depicting a prior art NVM reading circuit.

The various embodiments described herein are directed to circuits and methods configured for use in reducing delay periods associated with a reading of a selected NVM cell. As shown in FIG. 1, a prior art non-volatile memory (NVM) reading circuit 100 commonly operates with respect to an array 100 of memory cells (herein, "bit cells") 102. The bit cells 102 are often arranged in a row and column format having "M" rows and "N" columns, where each of M and N are integers, for example, bit cells 102(1×1), 102(1×2), to 102(M×N). Any number of rows and columns may be used for an array 101 and other formats may be used. Each bit cell is separately selectable by use of an address decoder 104, a row M driver 106, and a column N driver 108. Each bit cell is commonly coupled via a pair of bit lines 110 (M×N) and 111(M×N), to a multiplexer ("MUX") 112 providing corresponding read switches S1 to S6. When selected, by the MUX 112, a read switch is closed and the data stored on the selected bit cell (the "bit cell data"), as represented by a bit line current $I_{BL}$ provided on a given bit line ("BL"), is provided to a sensing amplifier ("SA") 114. Such bit lines being labeled herein as 110(M×N)/111 (M×N), and the currents provided thereon being shown by the labels $I_{BL-L}$ and $I_{BL-R}$.

It is to be appreciated that $I_{BL-L}$ and $I_{BL-R}$ typically must fall to within a sensitivity range for the given SA 114 before the bit cell data may be interpreted by the SA 114. The SA 114 then outputs the interpreted values in a data output signal ("DO") which can be used by other devices and for any reason.

For purposes of clarity only, signals for the prior art ("PA") NVM reading circuit 100 include the PA label and signals for a new NVM reading circuit 300 (FIG. 3A), configured in accordance with an embodiment of the present disclosure, include the label "(New)".

It is commonly appreciated that the reliability of such stored data obtained from a given bit cell is proportional to the signal strength provided on the selected bit lines 110/111. As shown in FIG. 1, bit cell 102(1×2) is shown as being selected and bit lines 110(1×2) and 111(1×2) are selected by the MUX 112 and currents $I_{BL-L}$ and $I_{BL-R}$ on such bit lines are provided to the SA 114.

Each bit cell 102 (M×N) may be configured in a differential bit cell topology (as shown in FIG. 1) or otherwise. For a differential bit cell topology, the sensing amplifier SA 114 may be configured to include opposing first and second differential current sensors 116 and 118 which output the data output signal DO based upon current differences $I_{DIF}$ between the currents $I_{BL-L}$ and $I_{BL-R}$ provided by the selected bit cell. The data output signal DO may be provided in any desired analog or digital form, at any voltage level, or otherwise. A voltage source 120 is used to recharge bit lines to an ideal voltage $V_{IDEAL}$, as discussed further below. Commonly, $V_{IDEAL}=V_{BL}$, where $V_{BL}$ is a bit line voltage output provided by the voltage source 120, $V_{BL}$ is discussed in greater detail below. For example, the following relationships may be used to determine a current value of the data output signal DO:

if $I_{DIF}>0 =>DO=$Log 1; and if $I_{DIF}<0 =>DO=$Log 0;

where $I_{DIF}=I_{BL-L}-I_{BL-R}$.

It is to be appreciated that when a single ended bit cell topology is used, a single bit line may be used. For example, the $I_{BL-L}$ signal may be used to provide bit cell values to the SA 114. For such a configuration, the data output signal DO may be determined in view of a reference current $I_{REF}$ and based on the following relationships:

if $I_{BL-L}>I_{REF}=>DO=$Log 1; and if $I_{BL-L}<I_{REF}=>DO=$Log 0.

It is to be appreciated that the various embodiments of the present disclosure are not limited to any bit cell topology; differential, single-ended, and/or other topologies may be used.

It is further commonly appreciated that when a pair of bit lines are selected, various input impedances resistances arise within the switches used in the MUX 112, such as switches S3 and S4, as illustrated by resistors R3 and R4. Likewise, input impedances arise in the SA 114, as illustrated by resistors R1 and R2. Such input impedances typically limit the current that can be provided to a bit line at a given voltage. Accordingly, response times for NVM reading circuits typically have an inverse relationship to response times of such NVM reading circuit.

Further, it is commonly appreciated that various parasitic capacitances arise during use of an NVM reading circuit 100. For example, various parasitic capacitances arise including: between the selected bit lines 110(×2) and 111 (1×2), as illustrated by capacitance C2; between the selected bit lines and non-selected bit lines, as illustrated by capacitances C1 and C3; and between a given bit line and a neutral potential, as illustrated by capacitances C4, C5, C6 and C7. These capacitances commonly are in the ten picofarad range (10 pF) and typically must be negated in order for the voltages on the selected bit lines, $V_{BL-L}$ and $V_{BL-R}$, to reach a threshold voltage that correspond to a current on the selected bit lines $I_{BC-L}$ and $I_{BC-R}$ that is within the sensitivity range of the SA 114. These relationships are further shown in FIGS. 2A to 2E.

As shown in FIGS. 2A to 2E, an NVM reading circuit 100 commonly operates by providing from an initial time t0 to a first time t1 data a "last read data," where the last read data corresponds to an immediately previously selected address. At the first time t1, new address data AD is provided to the NVM reading circuit 100, which results in a providing of a voltage potential to the selected bit cell, such as bit cell 102(1×2) (as shown in FIG. 1), the opening of any previously closed switches in the MUX 112, and the closing of switches R3 and R4. It is appreciated that an address delay time tan is incurred during which such configuring occurs. The address delay time tan is typically less than _____ nanoseconds (_____ns). At time t2, a new valid address has been received and the NVM reading circuit switches and the like appropriately configured. At t2 the SA 114 then provides a recharge voltage $V_{BL}$ (as shown in FIG. 1 and in FIG. 2B) to the selected bit lines (e.g., bit lines 110(1×2) and 111(1×2)). As shown, for a prior art system, recharging typically lasts from t2 until a fifth time t5. Further, $V_{BL-L}$ and $V_{BL-R}$ may recharge at different rates and such recharging continues until an ideal voltage $V_{IDEAL}$ is reached for both bit lines; where $V_{IDEAL}$ is the voltage corresponding to the current level for a sensing amplifier threshold $SA_{TH}$ for the sensing amplifier SA 114, where $SA_{TH}$ varies by sensing amplifier configuration.

Figure 2:
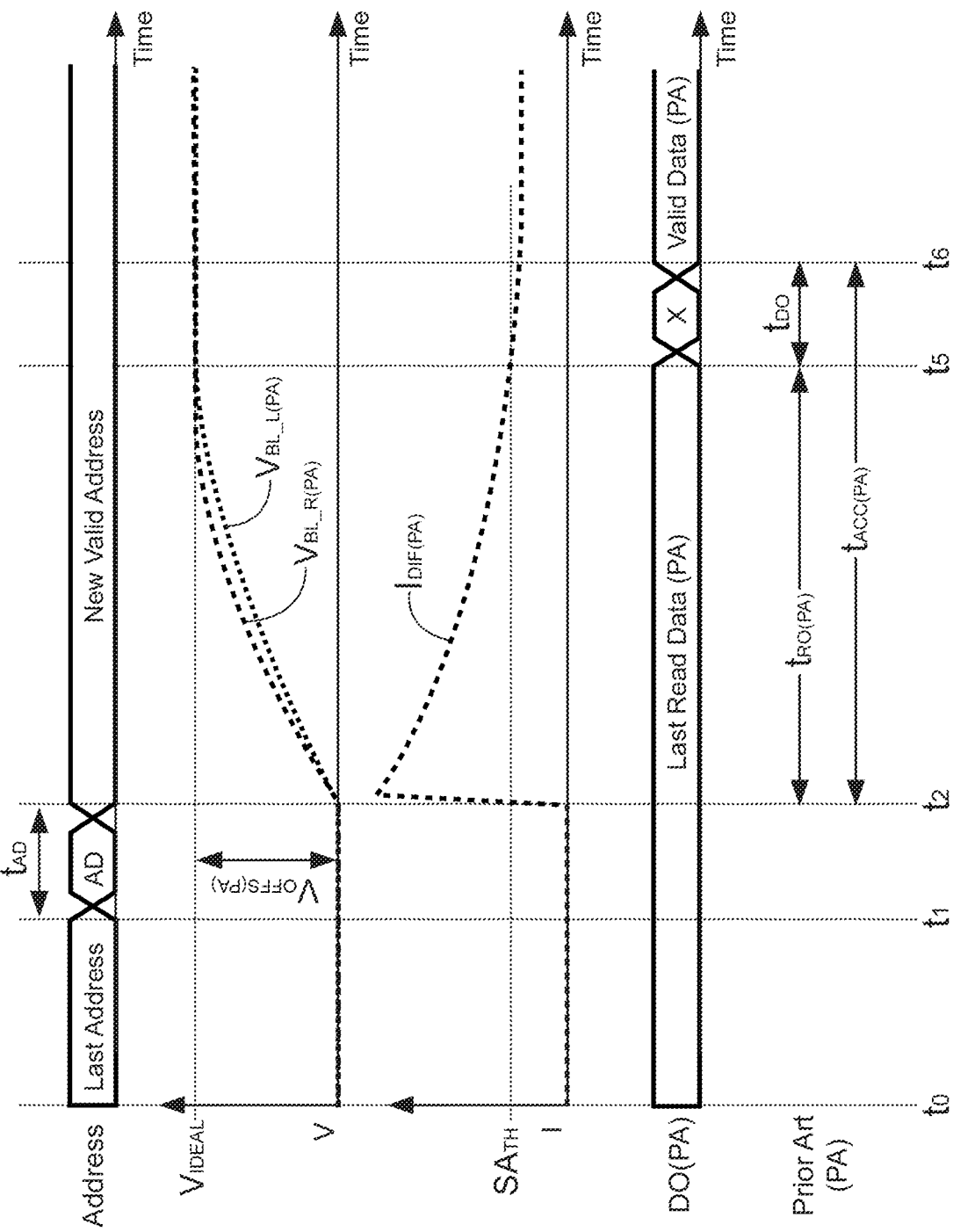
FIG. 2A is a timing diagram illustrating address data used for an NVM reading circuit.
FIG. 2B is a timing diagram illustrating voltages on an address line of a prior art NVM reading circuit.
FIG. 2C is a timing diagram illustrating currents on a bit line of a prior art NVM reading circuit.
FIG. 2D is a timing diagram illustrating data output by a sensing amplifier of a prior art NVM reading circuit.
FIG. 2E is a timing diagram illustrating time delays arising during use of a prior art NVM reading circuit.

As shown in FIG. 2C, while the selected bit lines are recharged, the currents on such bit lines (as represented by $I_{DIF}$) increase suddenly and then decrease until the fifth time t5, when the $SA_{TH}$ threshold is met. Accordingly, a sensing circuit delay $t_{RO}$ occurs from the second time, t2, until the fifth time t5. For prior art NVM reading circuits, the sensing circuit delay will often occur of tens of nanoseconds or longer.

As shown in FIG. 2D, when the $SA_{TH}$ threshold is met, at time t5, an output delay $t_{DO}$ often occurs from the fifth time t5 until a sixth time t6. This delay is commonly attributable to processing delays in the SA 114 itself, as opposed to delays arising during addressing and/or recharging of bit lines. At the sixth time t6 usable output data DO is available.

Accordingly and as shown in FIG. 2E, it is to be appreciated that prior art NVM reading circuits typically incur a total access delay $t_{ACC(PA)} = t_{AD} + t_{RO} + t_{DO}$, where tan and $t_{DO}$ are non-substantial in view of $t_{RO}$. The various embodiments of the present disclosure are configured to minimize $t_{RO}$ and thereby improve the responsive, efficiencies, heat characteristics, and other characteristics of NVM reading circuits. Also, improvements in each of the power figure of merit (FOM) and area FOM for NVM reading circuits may be realized by use of an embodiment of the present disclosure.

Figure 3:
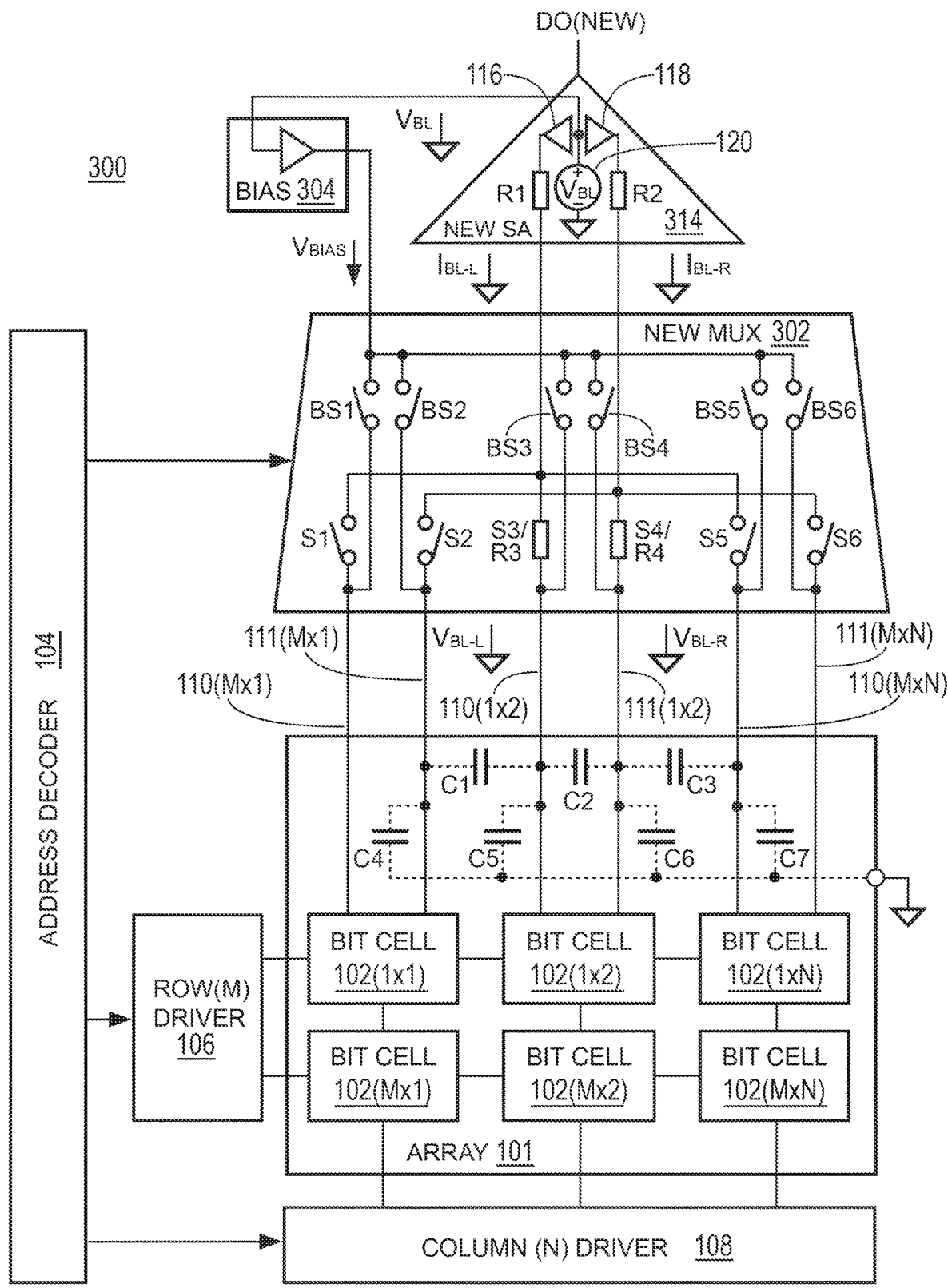
FIG. 3 is a schematic diagram of a new NVM reading circuit configured to reduce sensing circuit delays and in accordance with at least one embodiment of the present disclosure.

As shown in FIG. 3 and for at least one embodiment of the present disclosure, a new NVM reading circuit 300 configured to reduce sensing circuit delays $t_{RO}$ may include many of the components discussed above with respect to various prior art NVM reading circuits 100 including the array 101, bit cells 102(M×N), address decoder 104, row (M) driver 106, and column (N) driver 108. Further, the bit lines 110(M×N)/111(M×N) and read switches S1 to S6 may be used, and the intrinsic resistances R1 to R4, and parasitic capacitances C1 to C7 may arise. For at least one embodiment, the new NVM reading circuit 300 may result in power savings of twenty percent (20%) over prior art reading circuits. Such power savings may be realized without a substantial, if any, increase in the operating power consumed by the NVM reading circuit 300 and while realizing a reduction in $t_{RO}$.

Figure 4:
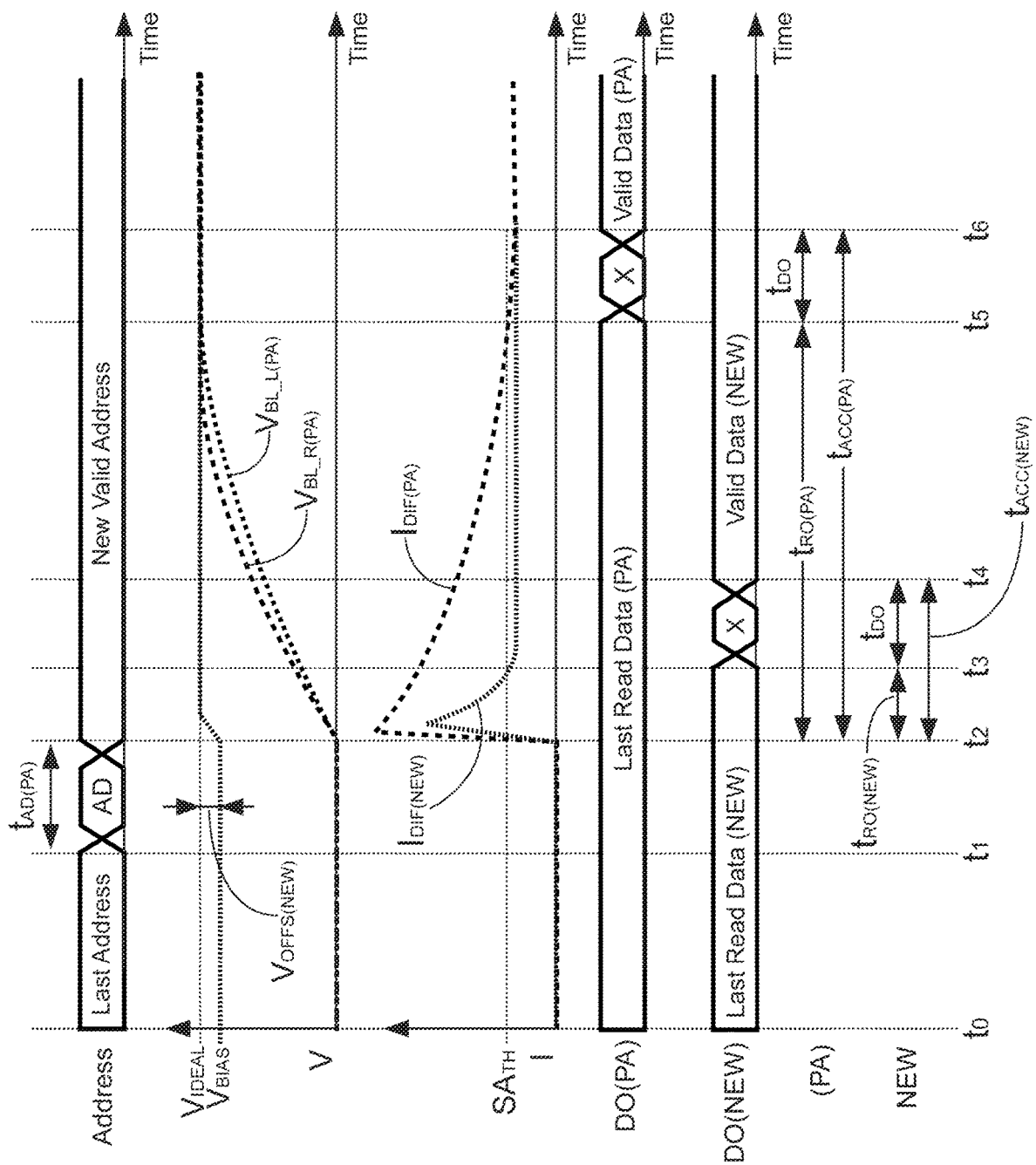
FIG. 4A is a timing diagram illustrating address data used for each of a prior art NVM reading circuit and for a new NVM reading circuit configured to reduce sensing circuit delays in accordance with at least one embodiment of the present disclosure.
FIG. 4B is a timing diagram illustrating voltages on a bit line of each of a prior art NVM reading circuit (as shown in dashed lines) and for a new NVM reading circuit configured to reduce sensing circuit delays (as shown in solid lines) in accordance with at least one embodiment of the present disclosure.
FIG. 4C is a timing diagram illustrating currents on of each of a prior art NVM reading circuit (as shown in dashed lines) and for a new NVM reading circuit configured to reduce sensing circuit delays (as shown in solid lines) in accordance with at least one embodiment of the present disclosure.
FIG. 4D is a timing diagram illustrating data output by a prior art sensing amplifier of a prior art NVM reading circuit, as shown in FIG. 2D, versus data output by a new sensing amplifier configured to reduce sensing circuit delays in accordance with at least one embodiment of the present disclosure.
FIG. 4E is a timing diagram illustrating timing delays arising by use of a prior art NVM reading circuit versus timing delays arising by use of a new NVM reading circuit configured to reduce sensing circuit delays in accordance with at least one embodiment of the present disclosure.

As shown in FIG. 3, a new NVM reading circuit 300 configured in accordance with at least one embodiment of the present disclosure may include a multiplexer, new MUX 302 that includes one or more bias switches BS, such as a first bias switch BS1, a second bias switch BS2, a third bias switch BS3, a fourth bias switch BS4, a fifth bias switch BS5, and a sixth bias switch BS6. A bias switch BS may be used in conjunction with one or more if not each bit line 110/111. The bias switches may be configured to selectively couple a given bit line 110/111 with a bias supply 304. The bias supply 304 may be configured to provide a bias voltage $V_{BIAS}$. For at least one embodiment, $V_{BIAS}$ is a replica of the bit line voltage $V_{BL}$. $V_{BIAS}$ may be fixed or varying. When varying, $V_{BIAS}$ may be adjusted, for example and not by limitation, based upon a then current bit line voltage $V_{BL}$, as provided by the new SA 314 to the bias supply 304. For at least one embodiment, $V_{BIAS}$ is commonly within than ten millivolts (10 mV) of the ideal voltage $V_{IDEAL}$. This difference is shown in FIG. 4B as $V_{OFFSET(NEW)}$ and can be expressed as: $V_{OFFSET(NEW)} \sim V_{IDEAL} \pm 10$ mV. In comparison, $V_{OFFSET(PA)} \sim V_{IDEAL} \pm 1$V.

As further shown in FIG. 3, the bias switches BS may be configured to couple non-selected (for reading) bit lines to the bias source 304 while decoupling selected bit lines therefrom. More specifically and with respect to the example shown in FIG. 3, where bit lines 110(1×2) and 111(1×2) are selected for reading, bias switches BS1, BS2, BS5 and BS6 are configured in a closed circuit configuration, while bias switches BS3 and BS4 are configured into an open circuit configuration. Similarly, when a next address to read is used, such as address lines 110(1×1) and 111(1×1), bias switches BS1 and BS2 would be opened, and bias switches BS3 and BS4 would be closed. Accordingly, the bias switches may be configured to operate in a reverse state with respect to a given read switch, such as read switches S1 to S6. More specifically and for example, bias switch BS1 may be configured to have an opposing state (open or closed) to read switch S1. Thus, when bit line 110(M×1) is selected for reading, bias switch BS1 is opened while read switch S1 is closed. When the reading of data from bit line 110(M×1) is complete (or otherwise terminated), bias switch BS1 is closed and read switch S1 is opened. Accordingly, it is to be appreciated that the reduction in $t_{RO}$ made possible by the various embodiments of the present disclosure may be realized by using for the new MUX 302 the same control signals communicated by the address decoder 104 to the prior art MUX 102.

As shown in FIGS. 4A to 4E, the new NVM reading circuit 300 may be configured to use the existing addressing schemes as used by the prior art NVM reading circuits 300. Accordingly, the timing information shown in FIG. 4A is the same as shown in FIG. 2A. Further, it is to be appreciated that the address delay time $t_{AD}$ remains unchanged by the embodiments of the present disclosure.

As shown in FIG. 4B, the various embodiments herein result in a substantial decrease in the sensing circuit delay $t_{RO}$. As shown in FIG. 4E, $t_{RO(NEW)}$ is substantially less than $t_{RO(PA)}$. This time reduction in $t_{RO}$ (as compared to $t_{RO(PA)}$) is realized by the bias supply 304 substantially continually pre-charging the non-selected bit lines to the $V_{BIAS}$ level. Accordingly, when a bit line is newly addressed, the voltage potential on such newly addressed bit line needs to be recharged only to overcome a voltage offset $V_{OFFS(NEW)}$. Further, since each non-selected bit line is maintained at $V_{BIAS}$, any differences arising between the $V_{BL-L}$ and $V_{BL-R}$ bit line voltages are insignificant, should any such differences arise in a first instance.

As shown in FIG. 4C, the reduction in $V_{OFFS(NEW)}$ (as compared to $V_{OFFS(PA)}$) also results in a corresponding reduction in the current spikes occurring during recharging of the bit lines. These current spike comparisons are illustrated by the notable differences between differential bit line current $I_{DIF(NEW)}$ as compared to $I_{DIF(PA)}$. For at least one embodiment, improvements in the range of 1/10 to 1/5 in the operating characteristics of the new NVM reading circuit 300 versus the prior art NVM reading circuit 100 may be realized. It is to be appreciated that reductions in current spikes incurred during recharging may result in improved electro-magnetic compatibility (EMC) performance.

As shown in FIG. 4D, $I_{DIF(NEW)}$ falls below $SA_{TH}$ at a second time t2. These reductions also result in data reading operations occurring earlier, at time t3, and new valid data being available at the fourth time t4. It is to be appreciated that the $I_{DIF(NEW)}$ response, as compared to the $I_{DIF(PA)}$ response, results in a new total access delay time $t_{ACC(NEW)}$ that is substantially improved over the prior art total access delay time $t_{ACC(PA)}$. In making such comparisons, it is assume that $t_{DO}$ and $t_{AD}$ remain constant and the same for both the new NVM reading circuit 300 and the old NVM reading circuit 100.

Figure 5:
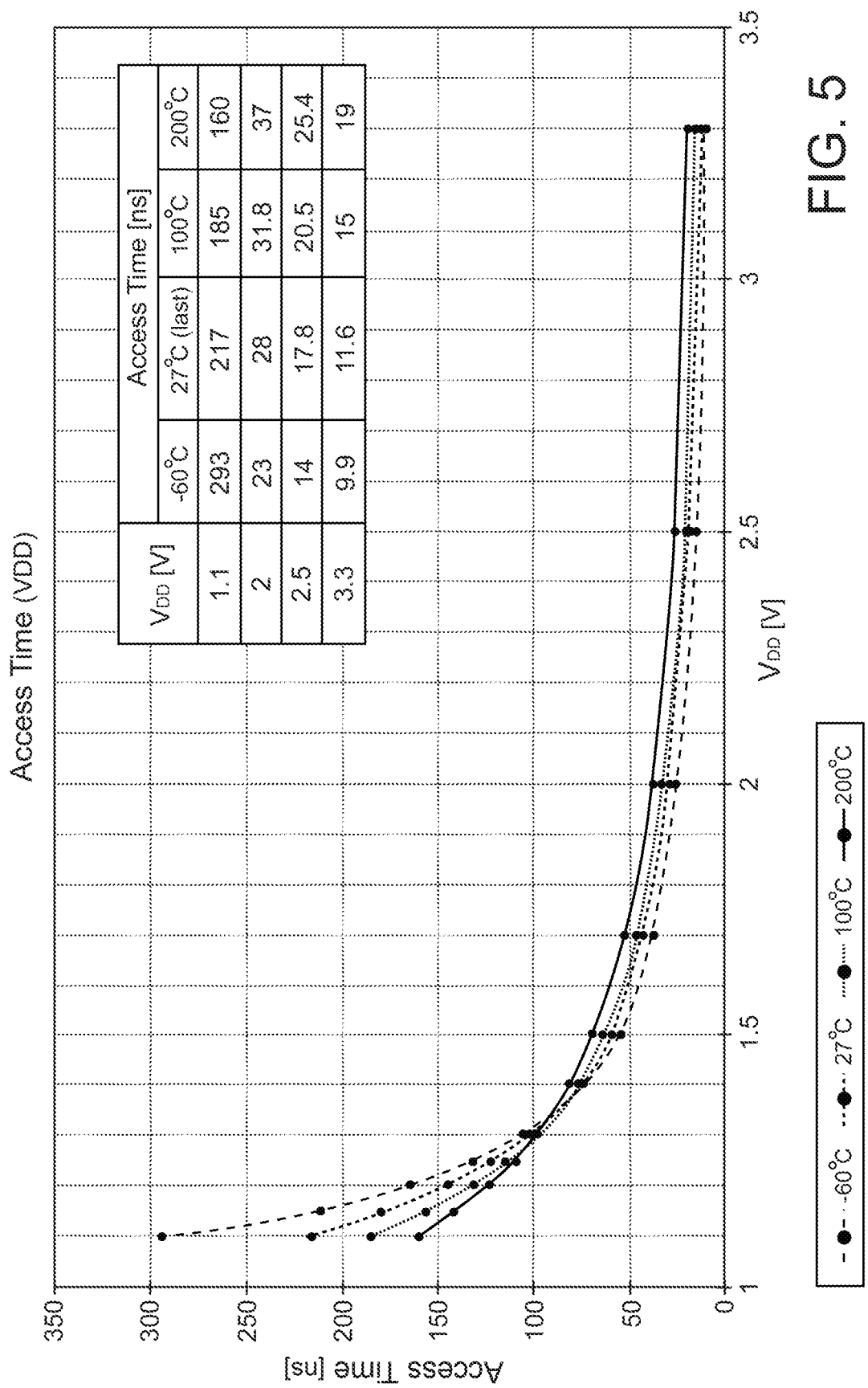
FIG. 5 is a graph illustrating one, non-limiting example of memory supply voltage versus total access time results that may be achieved using a new NVM reading circuit and in accordance with at least one embodiment of the present disclosure.

As shown in FIG. 5, a graph is provided which illustrates one, non-limiting, example of memory supply voltage $V_{DD}$ versus total access time $t_{ACC}$ results that may be achieved using a new NVM reading circuit 300 configured in accordance with at least one embodiment of the present disclosure. As shown, total access times $t_{ACC}$ of under fifty nanoseconds (50 nS) may be negligibly improved by increased memory supply voltages $V_{DD}$ over 1.5 Volts.

Figure 6:
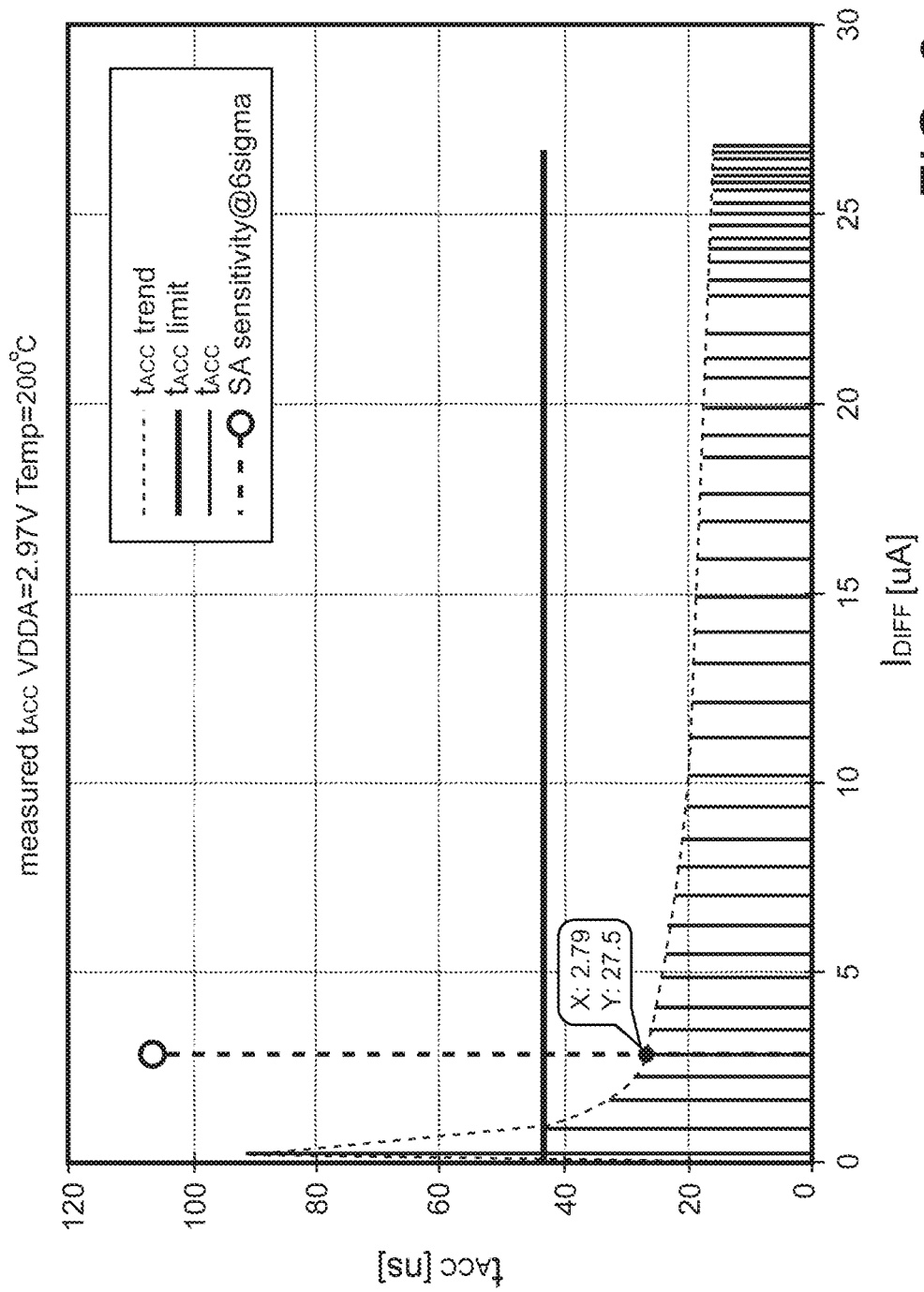
FIG. 6 is a graph illustrating one, non-limiting example of current differences versus total access time results that may be achieved using a new NVM reading circuit and in accordance with at least one embodiment of the present disclosure.

As shown in FIG. 6, a graph is provided which illustrates one, non-limiting example of current differences $I_{DIF}$ versus total access time $t_{ACC}$ results that may be achieved using a new NVM reading circuit and in accordance with at least one embodiment of the present disclosure. As shown, current differences $I_{DIF}$ of less than two-point-eight micro-Amps (2.8 uA) can result in total access times $t_{ACC}$ of less than twenty-seven-point-five nanoseconds (27.5 ns) and where additional increases in $I_{DIF}$ have decreasing impact on the $t_{ACC}$.

Figure 7:
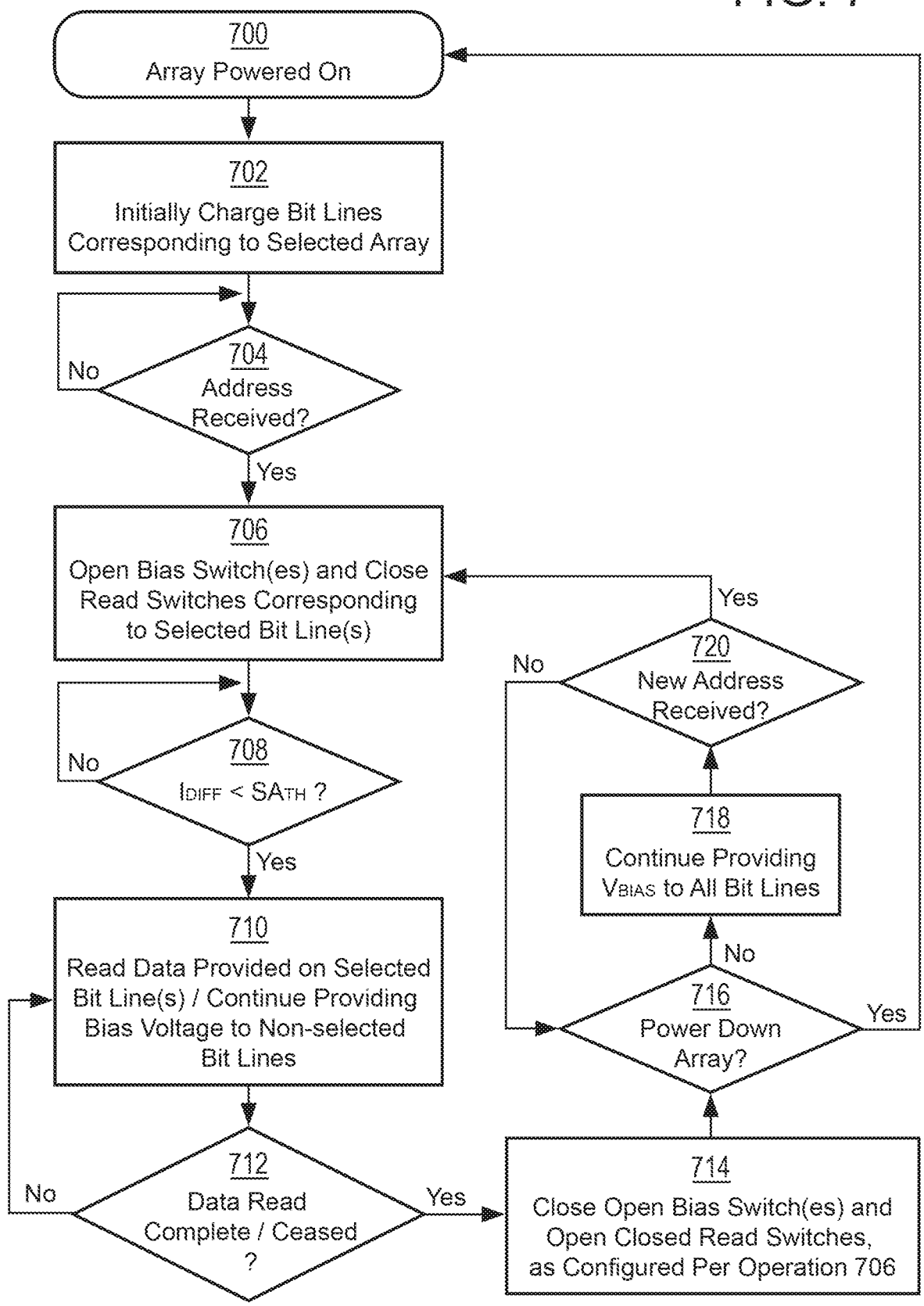
FIG. 7 is a flow chart illustrating one, non-limiting embodiment of a method for reducing sensing delay periods for NVM reading circuits and in accordance with at least one embodiment of the present disclosure.

As shown in FIG. 7, a method for reducing sensing delay periods for NVM reading circuits and in accordance with at least one embodiment of the present disclosure may begin when an array 100 is powered on, as per Operation 700.

Per Operation 702, the method may include initially charging the address lines coupling the array 100 with a sensing amplifiers SA 314. The bit lines may be initially charged to by bias voltage $V_{BIAS}$ by configuring each of the bias switches BS # into a closed circuit configuration.

Per Operation 704, the method may include awaiting receipt of an address instruction from the address decoder 104.

Per Operation 706, the method may include, when an address is received from the address decoder 104 the new MUX 302 opening the bias switches BS # and closing the read switches S # corresponding to the selected bit lines.

Per Operation 708, the method may include awaiting a decrease in the current difference $I_{DIFF}$ below the sensing amplifier threshold $SA_{TH}$.

Per Operation 710, the method may include reading, by the sensing amplifier SA 314, the data provided by the array 100 and on the selected bit lines while continuing to provide the bias voltage $V_{BIAS}$ to the non-selected bit lines.

Per Operation 712, the method may include determining when the data read from the array is complete or otherwise ceased.

Per Operation 714, the method may include closing any opened bias switches and opening any closed read switches, as so configured per Operation 706.

Per Operation 716, the method may include determining whether the array 100 is to be powered down, for example, into a standby mode, and/or off. If so, the method resumes at Operation 700.

Per Operation 718, the method may include continuing to provide the bias voltage $V_{BIAS}$ to all of the bit lines coupling the array 100 with the sensing amplifier SA 314.

Per Operation 720, the method may include determining whether a new address has been received. If so, the method continues with Operation 720. If a new address is not received, the method continues with Operation 716. The determining of a new address may occur based upon any methodology.

It is to be appreciated that the above described method of FIG. 7 is not limited to a particular sequence, combination, order, or otherwise of operations. Additional, fewer, operations in different orders, or otherwise may be used in accordance with one or more embodiments of the present disclosure. Further, the present technology has been described above with reference to several exemplary embodiments. However, changes and modifications may be made to the exemplary embodiments without departing from the scope of the present technology.

Although various embodiments of the claimed invention have been described above with a certain degree of particularity, or with reference to one or more individual embodiments, those skilled in the art could make numerous alterations to the disclosed embodiments without departing from the spirit or scope of the claimed invention. While the various figures used herein show various circuit embodiments, it is to be appreciated that other embodiments (not shown) may modify, reconfigure, add, and/or remove one or more circuit components, connections, couplings, or the like. The use of the terms "approximately" or "substantially" means that a value of an element has a parameter that is expected to be close to a stated value or position. However, as is well known in the art, there may be minor variations that prevent the values from being exactly as stated. Accordingly, anticipated variances, such as 10% differences, are reasonable variances that a person having ordinary skill in the art would expect and know are acceptable relative to a stated or ideal goal for one or more embodiments of the present disclosure. It is also to be appreciated that the terms "top" and "bottom", "left" and "right", "up" or "down", "first", "second", "next", "last", "before", "after", and other similar terms are used for description and ease of reference purposes only and are not intended to be limiting to any orientation or configuration of any elements or sequences of operations for the various embodiments of the present disclosure. The terms "coupled", "connected" or otherwise are not intended to limit such interactions and communication of signals between two or more devices, systems, components or otherwise to direct interactions; indirect couplings and connections may also occur. The terms "and" and "or" are not intended to be used in a limiting or expansive nature and cover any possible range of combinations of elements and operations of an embodiment of the present disclosure. Other embodiments are therefore contemplated. It is intended that all matter contained in the above description and shown in the accompanying drawings shall be interpreted as illustrative only of embodiments and not limiting. Changes in detail or structure may be made without departing from the basic elements of the invention as defined in the following claims.

What is claimed is:
1. A method, for reducing sensing delays for a non-volatile memory reading circuit, comprising:
 pre-charging, to a bit line voltage $V_{BL}$, a plurality of bit lines coupling a memory array having multiple bit cells with a sensing amplifier; and upon receiving a read request identifying a given bit cell in the memory array:
  decoupling, from a bias voltage, an addressed bit line; wherein the addressed bit line corresponds to the given bit cell and is selected from the plurality of bit lines; and
  coupling the addressed bit line to the sensing amplifier;
wherein a transient current occurs on the addressed bit line while a voltage on the addressed bit line increases or decreases;
wherein the transient current increases a total current on the addressed bit line;
wherein, while the transient current exists, the total current on the address bit line is a sum of the bit cell current and the transient current; and
wherein a value of the given bit cell is correctly discriminated by the sensing amplifier when the bit line current is free of the transient current.

2. The method of claim 1, further comprising:
after a sensing circuit delay,
providing, via the addressed bit line coupled to the sensing amplifier, data stored in the given bit cell to the sensing amplifier.

3. The method of claim 2, further comprising:
interpreting, by the sensing amplifier, the data stored in the given bit cell; and
generating, based on the interpreting, a data output signal corresponding to the interpreted data.

4. The method of claim 2,
wherein the interpreting occurs after an output delay $t_{DO}$.

5. The method of claim 1,
wherein the pre-charging occurs at a bias voltage $V_{BIAS}$; and
wherein the bias voltage is a function of an ideal voltage $V_{IDEAL}$ for the sensing amplifier.

6. The method of claim 5,
wherein the ideal voltage $V_{IDEAL}$ corresponds to the bit line voltage $V_{BL}$;
wherein upon coupling of the addressed bit line to the sensing amplifier, the voltage on the addressed bit line is changed (increased or decreased) until substantially equal to the bit line voltage $V_{BL}$;
wherein the transient current occurs while the voltage on the addressed bit line increases or decreases to substantially equal to the bit line voltage $V_{BL}$;
wherein the sensing amplifier is configured to receive data from the given bit cell when the total current on the address bit line equals a bit cell current only and without being disturbed by a transient current; and
wherein when the addressed bit line current is free of the transient current, the addressed bit line current exceeds a sensing amplifier threshold $SA_{TH}$.

7. The method of claim 5,
wherein the bias voltage $V_{BIAS}$ is sufficient to overcome one or more parasitic capacitances arising between two or more of the addressed bit line and the plurality of bit lines.

8. The method of claim 1,
wherein the pre-charging of the plurality of bit lines reduces currents used to overcome parasitic capacitances arising between two or more of the plurality of bit lines; and
wherein the pre-charging of the plurality of bit lines reduces operating temperatures of the non-volatile memory reading circuit.

9. The method of claim 1,
wherein the coupling and decoupling of the addressed bit line occurs in a multiplexer configured to couple two or more of the multiple bit cells with the sensing amplifier.

10. A multiplexer, configured to reduce sensing delay periods for memory reading circuits, comprising:
a first bias switch coupled to a first bit line;
a first read switch coupled to the first bit line; and
wherein the first bit line is coupled between a first bit cell of a memory array and a bias supply when the first bias switch is in a closed state and the first read switch is in an open state;
wherein the first bit line is coupled between the first bit cell of the memory array and a sensing amplifier when the first bias switch is in an open state and the first read switch is in a closed state;
wherein the first bias switch and the first read switch have opposing states;
wherein a transient current occurs on the first bit line while a voltage on the first bit line increases or decreases;
wherein the transient current increases a total current on the first bit line;
wherein, while the transient current exists, the total current on the first bit line is a sum of a bit cell current and the transient current; and
wherein a value of the first bit cell is correctly discriminated by the sensing amplifier when the bit line current is free of the transient current.

11. The multiplexer of claim 10, further comprising:
a second bias switch coupled to a second bit line;
a second read switch coupled to the second bit line; and
wherein the second bit line is coupled between a second bit cell of the memory array and the bias supply when the second bias switch is in a closed state and the second read switch is in an open state;
wherein the second bit line is coupled between the second bit cell of the memory array and the sensing amplifier when the second bias switch is in an open state and the second read switch is in a closed state;
wherein the second bias switch and the second read switch have opposing states; and
wherein the first bias switch and the second bias switch have opposing states.

12. The multiplexer of claim 10,
wherein the bias supply provides a bias voltage $V_{BIAS}$ for use in pre-charging the first bit line when the first bias switch is closed.

13. The multiplexer of claim 10,
wherein the first bit line further comprises a pair of bit lines for use in selectable coupling, at any given time, the first bit cell to one of the bias supply and the sensing amplifier; and
wherein a difference current $I_{DIF}$ between currents on each of the pair of bit lines above a sensing amplifier threshold $SA_{TH}$ incurs a sensing circuit delay $t_{RO}$ during which a reading of data stored in the bit cell by the sensing amplifier is precluded.

14. The multiplexer of claim 13,
wherein the bias supply is configured to provide a bias voltage $V_{BIAS}$ for use in pre-charging the pair of bit lines when the first bias switch is closed; and
wherein the pre-charging of the pair of bit lines reduces the sensing circuit delay $t_{RO}$.

15. The multiplexer of claim 10,
wherein a difference current $I_{DIF}$ is a difference between a current on the first bit line $I_{BL}$ versus a reference current $I_{REF}$; and
wherein, when the difference current $I_{DIF}$ is above a sensing amplifier threshold $SA_{TH}$, a sensing circuit delay $t_{RO}$ occurs during which a reading of data stored in the bit cell by the sensing amplifier is precluded.

16. The multiplexer of claim 10,
wherein the states of the first bias switch and the first read switch are configured based upon an address provided by an address decoder.

17. A non-volatile memory reading circuit comprising:
an address decoder;
an array comprising:
  a first bit cell; and
  a second bit cell;
a multiplexer comprising:
  a first bias switch;
  a first read switch;
  a second bias switch; and
  a second read switch;
a sensing amplifier;
a bias supply;
a first bit line; and
a second bit line;
wherein, when the first bit cell is selected by the address decoder:
  the first bit line couples, via the first read switch, the first bit cell with the sensing amplifier; and
  the second bit line couples, via the second bias switch, the second bit cell with the bias supply; and
wherein, when the second bit cell is selected by the address decoder:
  the second bit line couples, via the second read switch, the second bit cell with the sensing amplifier; and
  the first bit line couples, via the first bias switch, the first bit cell with the bias supply; and
wherein a transient current occurs on the first bit line while a voltage on the first bit line increases or decreases;
wherein the transient current increases a total current on the first bit line;
wherein, while the transient current exists, the total current on the first bit line is a sum of a bit cell current and the transient current; and
  wherein a value of the first bit cell is correctly discriminated by the sensing amplifier when the total current of the first bit line is free of the transient current.

18. The non-volatile memory reading circuit of claim 17,
wherein the bias supply provides a bias voltage $V_{BIAS}$ selected to reduce a sensing circuit delay $t_{RO}$ occurring when a given of the first bit cell and the second bit cell is selected by the address decoder.

19. The non-volatile memory reading circuit of claim 18,
wherein the sensing circuit delay $t_{RO}$ is a function of one or more parasitic capacitances arising between the first bit line and the second bit line.

20. The non-volatile memory reading circuit of claim 18,
wherein the bias voltage pre-charges a non-selected bit line to a bit line voltage $V_{BL}$ which is within ten millivolts (10 mV) of an ideal voltage $V_{IDEAL}$ for the sensing amplifier.

* * * * *